US011871517B1

(12) United States Patent
Hossain et al.

(10) Patent No.: US 11,871,517 B1
(45) Date of Patent: Jan. 9, 2024

(54) ELECTRONIC DEVICES WITH STACKED CIRCUITRY

(71) Applicant: Apple Inc., Cupertino, CA (US)

(72) Inventors: Muhammad F. Hossain, Sunnyvale, CA (US); Syed F. Mohiuddin, Santa Clara, CA (US); Ritu Shah, Sunnyvale, CA (US); Jonathan C. Atler, San Francisco, CA (US); Nicholas C. Soldner, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 14 days.

(21) Appl. No.: 17/200,608

(22) Filed: Mar. 12, 2021

Related U.S. Application Data

(60) Provisional application No. 63/023,158, filed on May 11, 2020.

(51) Int. Cl.
    *G06F 1/16* (2006.01)
    *H05K 1/14* (2006.01)
    *H05K 1/18* (2006.01)

(52) U.S. Cl.
    CPC .............. *H05K 1/147* (2013.01); *H05K 1/189* (2013.01); *H05K 2201/10128* (2013.01)

(58) Field of Classification Search
    CPC .......... G06F 1/16; H05K 1/147; H05K 1/189; H05K 2201/10128
    USPC ......................................................... 361/749
    See application file for complete search history.

(56) References Cited

U.S. PATENT DOCUMENTS

| | | | |
|---|---|---|---|
| 9,368,083 B2 | 6/2016 | Sakamaki et al. | |
| 9,454,025 B2 | 9/2016 | Zhong et al. | |
| 9,582,036 B2 | 2/2017 | Bibl et al. | |
| 9,654,863 B2 | 5/2017 | Crosby et al. | |
| 9,756,733 B2 | 9/2017 | Drzaic et al. | |
| 10,467,952 B2 | 11/2019 | Pan | |
| 10,475,148 B2 | 11/2019 | Parikh et al. | |
| 11,602,058 B2* | 3/2023 | Kim ...................... | H05K 5/0226 |
| 2005/0125093 A1 | 6/2005 | Kikuchi et al. | |
| 2013/0194739 A1* | 8/2013 | Nakajima ............... | G06F 1/162 361/679.09 |
| 2018/0114800 A1 | 4/2018 | Pan | |
| 2021/0052140 A1* | 2/2021 | Tata ........................ | A61B 1/008 |
| 2022/0068154 A1* | 3/2022 | Breed ...................... | G06F 3/167 |

FOREIGN PATENT DOCUMENTS

EP          1698931 A1      9/2006

* cited by examiner

*Primary Examiner* — Tremesha S Willis
(74) *Attorney, Agent, or Firm* — Treyz Law Group, P.C.; G. Victor Treyz; Tianyi He

(57) ABSTRACT

An electronic device may have a display with an array of pixels for displaying images. The electronic device may also have a lens through which the images are viewable on the display. The display may have a display panel that is mounted to a printed circuit stack. The printed circuit stack may include multiple printed circuit layers to which components are mounted. The components may include an orientation sensor overlapped by the display panel. A camera may be mounted to a printed circuit stack and may overlap one or more electrical components such as an orientation sensor. The printed circuit stacks may include rigid and flexible printed circuits coupled together using solder and other conductive connections. Air gaps may be created between stacked printed circuit layers.

20 Claims, 8 Drawing Sheets

ELECTRONIC DEVICES WITH STACKED CIRCUITRY

This application claims the benefit of provisional patent application No. 63/023,158, filed May 11, 2020, which is hereby incorporated by reference herein in its entirety.

FIELD

This relates generally to electronic devices, and, more particularly, to assemblies of electrical components for electronic devices.

BACKGROUND

Electronic devices often include electrical components such as cameras and displays. Printed circuit boards may contain signal paths that route signals between electrical components.

SUMMARY

An electronic device may have a display with an array of pixels for displaying images. The electronic device may have a lens through which the images are viewable on the display. The display may have a display panel that is mounted to a printed circuit stack. The printed circuit stack may include multiple printed circuit layers to which components are mounted. The components may include an orientation sensor, other sensors, a display driver integrated circuit, and/or other electrical components that are overlapped by the display panel.

The electronic device may include a camera. The camera may be mounted to a printed circuit stack and may overlap one or more electrical components such as an orientation sensor and/or other sensors.

The printed circuit stacks may include rigid and flexible printed circuits coupled together using solder and other conductive connections. Air gaps may be created between the layers in a stacked printed circuit. Integrated circuits and other electrical components may be mounted to the surface of a printed circuit layer in an air gap that is overlapped by a display or camera and/or may be formed on other printed circuit layers. Electrical components such as orientation sensors and/or other sensors may also be embedded within one or more printed circuit layers in a printed circuit stack (e.g., in an area of the printed circuit stack that is overlapped by a camera and/or display).

DETAILED DESCRIPTION

An electronic device may have input-output devices such as cameras, displays, and sensors. These input-output devices and other circuits in the electronic device may be formed from electronic components such integrated circuits and discrete components (e.g., capacitors, inductors, resistors, transistors, etc.) mounted to printed circuit boards. Printed circuits may be formed from stacked printed circuit layers. Printed circuit assemblies that contain one or more electronic components coupled to a printed circuit stack may be used to help conserve space within an electronic device, to reduce noise and signal interference effects, to improve power efficiency, and/or to tightly couple components together.

Figure 1:
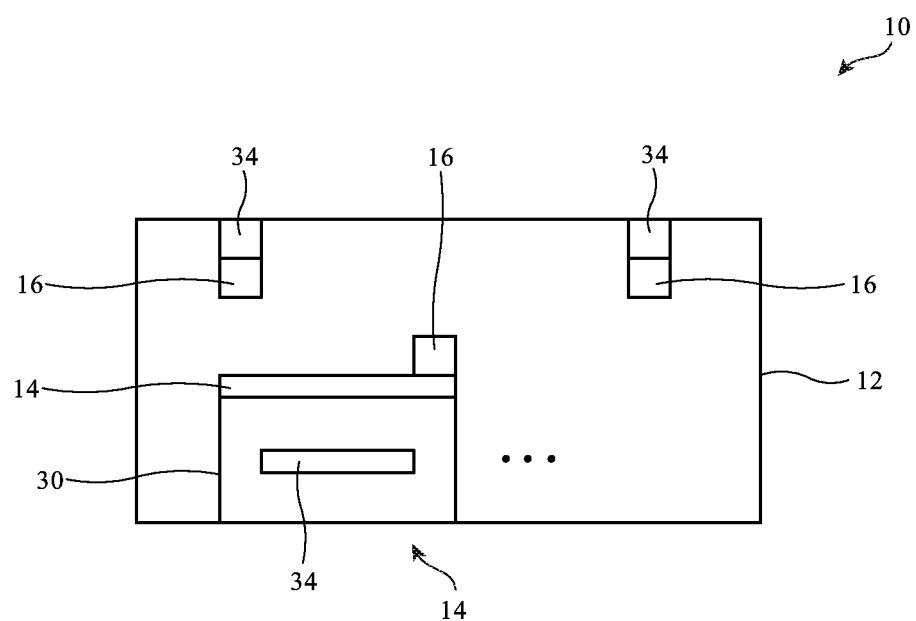
FIG. 1 is a diagram of an illustrative electronic device in accordance with an embodiment.

A side view of an illustrative electronic device of the type that may include one or more printed circuit assemblies is shown in FIG. 1. Device 10 may be a laptop computer, a computer monitor containing an embedded computer, a tablet computer, a desktop computer, a cellular telephone, a media player, or other handheld or portable electronic device, a smaller device such as a wristwatch device, a wristband device, a pendant device, a headphone or earpiece device, a head-mounted device such as glasses, goggles, a helmet, or other equipment worn on a user's head, or other wearable or miniature device, a television, a computer display that does not contain an embedded computer, a gaming device, a navigation device, an embedded system such as a system in which equipment is mounted in a kiosk, in an automobile, airplane, or other vehicle, a removable external case for electronic equipment, an accessory such as a remote control, computer mouse, track pad, wireless or wired keyboard, or other accessory, and/or equipment that implements the functionality of two or more of these devices.

As shown in FIG. 1, device 10 may have a housing such as housing 12. Housing 12 may be formed from materials such as polymer, glass, metal, crystalline materials such as sapphire, ceramic, fabric, foam, wood, other materials, and/or or combinations of these materials. Device 10 may have any suitable shape. Housing 12 may, for example, be configured to form a portable device housing for a handheld device such as a cellular telephone, a housing for a larger portable device such as a laptop computer, a head-mounted housing or other wearable housing for a wearable electronic device such as a head-mounted device, wristwatch, or other device worn on a user's body, or a housing for other electronic equipment. Electrical components may be supported by and/or enclosed by housing 12.

Device 10 may have one or more displays such as display 14. Display 14 may be a touch screen display mounted on an exterior surface of device 10 (e.g., the front face of housing 12 in a cellular telephone or tablet computer, the upper housing portion of housing 12 in a foldable laptop computer, etc.). In a head-mounted device, one or more displays such as display 14 may each be mounted in an optical module such as optical module 30. There may be, for example, a left optical module in housing 12 to present images to a left eye box associated with a user's left eye and a right optical module in housing 12 to present image to a right eye box associated with a user's right eye. Each optical module may have a lens such as lens 32 through which images on the display of that optical module may be viewed from the eye box associated with that optical module.

Device 10 may have input-output devices such as cameras 34. Cameras 34 may be visible light cameras and/or may be sensitive at infrared wavelengths. There may be multiple cameras 34 in device 10. For example, in a cellular telephone, one camera may face the user and another camera may face away from the user. In a head-mounted device, two or more cameras 34 may be located on different portions of housing 14 to capture images of the real world (e.g., so that these images may be merged with computer-generated information on displays 14).

It may be desirable to physically couple sensors and electronic components such as cameras 34 and displays 14. For example, it may be desirable to mount an inertial measurement unit or other orientation sensor directly to a camera 34 (or a printed circuit directly connected to camera 34) and/or it may be desirable to mount an inertial measurement unit or other orientation sensor directly to display 14 (e.g., a display panel containing an array of pixels for display 14, other display structures, a printed circuit to which display 14 is coupled, or optical module 30). This may allow the alignment of cameras 34 and/or display 14 to be monitored in real time. By gathering orientation information (e.g., real-time camera orientation information and/or real-time display orientation, control circuitry 20 can adjust displayed images and/or otherwise compensate for detected misalignment between cameras and/or displays), can use the orientation information in combining real-world images and computer-generated content, and/or can otherwise operate device 10 using the orientation information. Configurations such as these are illustrated in FIG. 1, which shows how sensors 16 may be mounted to cameras 34 and/or optical module 30 (display 14). If desired, device 10 may have printed circuit assemblies in which sensors 16, electronic components such as cameras 34, displays 14, and/or other input-output devices are mounted together using one or more printed circuit substrates.

Figure 2:
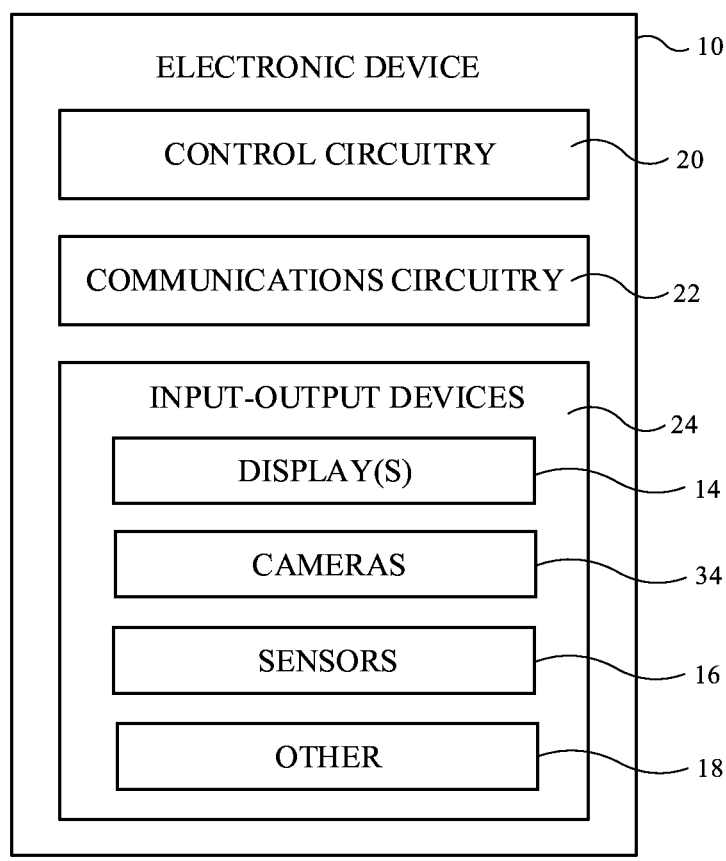
FIG. 2 is a schematic diagram of an illustrative electronic device in accordance with an embodiment.

A schematic diagram of an illustrative electronic device is shown in FIG. 2. Device 10 of FIG. 2 may be operated as a stand-alone device and/or the resources of device 10 may be used to communicate with external electronic equipment. As an example, communications circuitry in device 10 may be used to transmit user input information, sensor information, and/or other information to external electronic devices (e.g., wirelessly or via wired connections) and/or may be used to receive such information from external electronic devices. Each of these external devices may include components of the type shown by device 10 of FIG. 2.

As shown in FIG. 2, electronic device 10 may include control circuitry 20. Control circuitry 20 may include storage and processing circuitry for supporting the operation of device 10. The storage and processing circuitry may include storage such as nonvolatile memory (e.g., flash memory or other electrically-programmable-read-only memory configured to form a solid-state drive), volatile memory (e.g., static or dynamic random-access-memory), etc. Processing circuitry in control circuitry 20 may be used to gather input from sensors (e.g., cameras) and other input devices and may be used to control output devices. The processing circuitry may be based on one or more microprocessors, microcontrollers, digital signal processors, baseband processors and other wireless communications circuits, power management units, audio chips, application specific integrated circuits, etc. During operation, control circuitry 20 may use display(s) 14 and other output devices in providing a user with visual output and other output.

To support communications between device 10 and external equipment, control circuitry 20 may communicate using communications circuitry 22. Circuitry 22 may include antennas, radio-frequency transceiver circuitry, and other wireless communications circuitry and/or wired communications circuitry. Circuitry 22, which may sometimes be referred to as control circuitry and/or control and communications circuitry, may support bidirectional wireless communications between device 10 and external equipment (e.g., a companion device such as a computer, cellular telephone, or other electronic device, an accessory such as a point device, computer stylus, or other input device, speakers or other output devices, etc.) over a wireless link. For example, circuitry 22 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link. Wireless communications may, for example, be supported over a Bluetooth® link, a WiFi® link, a wireless link operating at a frequency between 10 GHz and 400 GHz, a 60 GHz link, or other millimeter wave link, a cellular telephone link, or other wireless communications link. Device 10 may, if desired, include power circuits for transmitting and/or receiving wired and/or wireless power and may include batteries or other energy storage devices. For example, device 10 may include a coil and rectifier to receive wireless power that is provided to circuitry in device 10.

Device 10 may include input-output devices such as devices 24. Electronic components such as input-output devices 24 may be used in gathering user input, in gathering information on the environment surrounding the user, and/or in providing a user with output.

Devices 24 may include one or more displays such as display(s) 14. Display(s) 14 may include one or more display devices such as organic light-emitting diode display panels (panels with organic light-emitting diode pixels formed on polymer substrates or silicon substrates that contain pixel control circuitry), liquid crystal display panels, microelectromechanical systems displays (e.g., two-dimensional mirror arrays or scanning mirror display devices), display panels having pixel arrays formed from crystalline semiconductor light-emitting diode dies (sometimes referred to as microLEDs), and/or other display devices.

Devices 24 may also include cameras 34. Cameras 34 may include visible light cameras, infrared cameras, and/or cameras that are sensitive at multiple wavelengths, may include three-dimensional camera systems such as depth sensors (e.g., structured light sensors and/or depth sensors based on stereo imaging devices that capture three-dimensional images), may include time-of-flight cameras, and/or may include other cameras. Cameras 34 may face toward the user of device 10 and/or away from the user of device 10.

Sensors 16 in input-output devices 24 may include force sensors (e.g., strain gauges, capacitive force sensors, resistive force sensors, etc.), audio sensors such as microphones, touch and/or proximity sensors such as capacitive sensors such as a touch sensor that forms a button, trackpad, or other input device), and other sensors. If desired, sensors 16 may include optical sensors such as optical sensors that emit and detect light, ultrasonic sensors, optical touch sensors, optical proximity sensors, and/or other touch sensors and/or proximity sensors, monochromatic and color ambient light sensors, fingerprint sensors, iris scanning sensors, retinal scanning sensors, and other biometric sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors such as blood oxygen sensors, heart rate sensors, blood flow sensors, and/or other health sensors, radio-frequency sensors, optical sensors such as self-mixing sensors and light detection and ranging (lidar) sensors, humidity sensors, moisture sensors, gaze tracking sensors, electromyography sensors to sense muscle activation, facial sensors, interferometric sensors, time-of-flight sensors, magnetic sensors, resistive sensors, distance sensors, angle sensors, and/or other sensors. In some arrangements, device 10 may use sensors 16 and/or other input-output devices 24 to gather user input. For example, input-output devices 24 such as buttons may be used to gather button press input, touch sensors overlapping displays can be used for gathering user touch screen input, touch pads may be used in gathering touch input, microphones may be used for gathering audio input (e.g., voice commands), accelerometers may be used in monitoring when a finger contacts an input surface and may therefore be used to gather finger press input, etc.

Input-output devices 24 may include optical components such as depth sensors (e.g., structured light sensors or other sensors that gather three-dimensional image data), optical proximity sensors, ambient light sensors (e.g., color ambient light sensors), optical time-of-flight sensors and other sensors 16 that are sensitive to visible and/or infrared light and that may emit visible and/or infrared light (e.g., devices 24 may contain optical sensors that emit and/or detect light). For example, a visible-light image sensor in a camera may have a visible light flash or an associated infrared flood illuminator to provide illumination while the image sensor captures a two-dimensional and/or three-dimensional image. An infrared camera such as an infrared structured light camera that captures three-dimensional infrared images may have an infrared flood illuminator that emits infrared flood illumination and/or may have a dot projector the emits an array of infrared light beams. Infrared proximity sensors may emit infrared light and detect the infrared light after the infrared light has reflected from a target object.

If desired, electronic device 10 may include additional components (see, e.g., other devices 18 in input-output devices 24). The additional components may include haptic output devices, actuators for moving movable structures in device 10, audio output devices such as speakers, light-emitting diodes for status indicators, light sources such as light-emitting diodes that illuminate portions of a housing and/or display structure, other optical output devices, and/or other circuitry for gathering input and/or providing output. Device 10 may also include a battery or other energy storage device, connector ports for supporting wired communication with ancillary equipment and for receiving wired power, and other circuitry.

Figure 3:
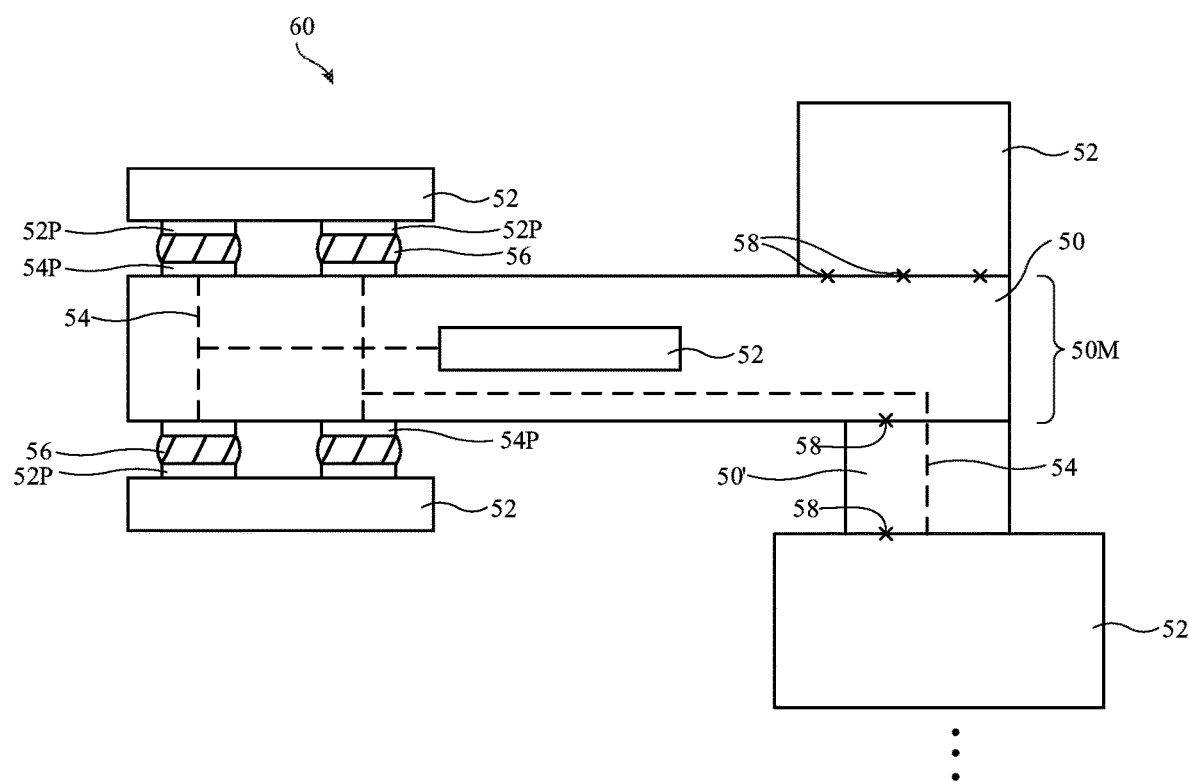
FIG. 3 is side view of an illustrative assembly including electronic components and printed circuit board structures in accordance with an embodiment.

FIG. 3 is a side view of an illustrative printed circuit assembly of the type that may be used in device 10. As shown in FIG. 3, printed circuit assembly 60 may have one or more components 52. Components 52 may be coupled directly and/or indirectly to printed circuit board 50. Components 52 may include integrated circuits, discrete components such as resistors, capacitors, and/or inductors, packaged input-output devices 24, and/or other electrical devices (e.g., displays 14, cameras 34, sensors 16, other components 18, and/or other input-output devices 24 of FIG. 2, control circuitry 20, communications circuitry 22, etc.).

Printed circuit (printed circuit layer) 50 may be a rigid printed circuit board formed from a rigid printed circuit board substrate material such as fiberglass-filled epoxy, may be a flexible printed circuit (e.g., a printed circuit having a bendable polyimide substrate or a substrate formed from a sheet of other flexible polymer), may be a printed circuit having rigid and flexible portions (sometimes referred to as a ridged flex printed circuit), and/or may be any other suitable printed circuit. Printed circuit 50 has one or more layers of dielectric substrate material and has conductive signal paths 54. Signal paths 54 may be formed from metal traces or other conductive structures and may include vias, embedded signal lines, and other conductive structures embedded in printed circuit and/or may contain externally facing metal traces or other conductive structures on one or more external surfaces of printed circuit 50 such as contacts (contact pads) 52P.

Conductive joints such as welds, solder joints, conductive adhesive joints, spring-loaded-pin connections, and/or other conductive connections may be used in electrically connecting components 52 to signal paths 54. For example, solder 56 or other conductive material may be used in forming electrical connections between contacts 54P of printed circuit 50 and corresponding contacts (solder pads) 52P on components 52.

If desired, one or more additional printed circuits may be coupled to printed circuit 50 to form a printed circuit stack (sometimes referred to as a logic board or printed circuit). For example, additional printed circuit 50' (which may serve, for example, as a spacer), may have signal paths 54 coupled to the signal paths 54 of printed circuit 50 (e.g., using solder 56, conductive adhesive, or other electrical connections). Signal paths 54 of printed circuit 50' may, in turn, be coupled to additional printed circuit layers and/or may be coupled to the terminals of component 52.

As shown in FIG. 3, in addition to or instead of electrically and mechanically coupling components 52 to signal paths 54 on the upper and/or lower surfaces of printed circuit 50 and/or embedding one or more components 52 within printed circuit 50 and thereby electrically and mechanically coupling components 52 to signal paths 54 in printed circuit 50, adhesive and/or other attachment structures 58 may be used in attaching components 52 to printed circuit 50 (and/or additional printed circuits such as illustrative additional printed circuit 50'). Attachment structures 58 may, as an example, be used to attach a plastic package or other component housing structures associated with components 52 to printed circuit 50. This helps mechanically support components 52. Electrical connections may be made using solder 56 or other electrical connections.

In general, any suitable number of printed circuit boards such as printed circuit 50 and stacked printed circuit 50' may be included in a printed circuit stack forming printed circuit assembly 60 and any suitable number of components 52 may be electrically and mechanically coupled to the printed circuit of assembly 60 (e.g., a single component 52, at least one component 52, at least two components 52, at least five components 52, fewer than 50 components 52, etc.).

Components 52 that have electrical contacts and/or housings that are directly attached to contacts 54P or other structures on the surfaces of printed circuit 50 are sometimes referred to as directly mounted components. Components 52 such as the component mounted to additional printed circuit board 50' may sometimes be referred to as being indirectly mounted components, because these component are coupled to printed circuit 50 using the signal paths that pass through additional printed circuit 50'. In some configurations, stacked printed circuits such as printed circuit 50 and additional printed circuit 50' are referred to as forming a unitary "printed circuit" (e.g., printed circuits 50 and 50' serve as respective sub-layers in printed circuit board 50MLB, which may sometimes be referred to as a main logic board or printed circuit stack).

Figure 4:
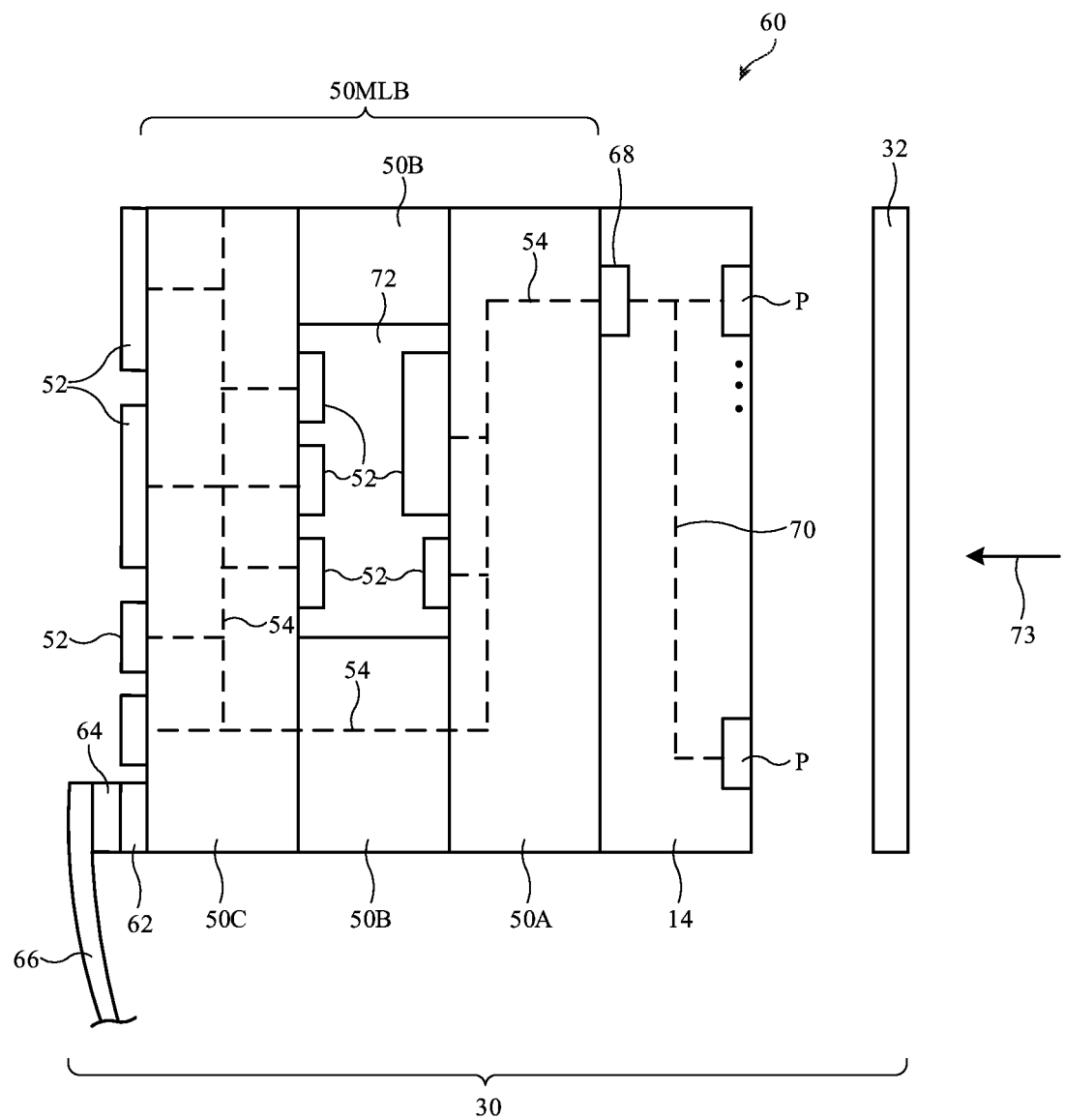
FIG. 4 is side view of an illustrative assembly with a display in accordance with an embodiment.

Consider, as an example, printed circuit assembly 60 of FIG. 4. In the example of FIG. 4, printed circuit assembly 60 includes display 14. Display (display panel) 14 has an array of pixels P that generate an image. The image is viewable by a user through lens 32. Lens 32 and printed circuit assembly 60 may be supported in housing 12 (e.g., lens 32 and printed circuit assembly 60 may be coupled to a common lens barrel or other optical module support structure for optical module 30).

Display 14 may have signal paths 70 formed from solder pads (see, e.g., display contacts 68), vias, embedded metal traces, and/or other metal traces in the substrate of display 14). The substrate of display 14 may be formed from dielectric (e.g., polymer), silicon or other semiconductor substrate material, and/or other substrate materials. Display 14 may be, as an example, a light-emitting diode display such as an organic light-emitting diode display (as an example). Contacts 68 may be formed on the backside (non-pixel side) of display 14 or other portion of display 14. Display (display panel) 14 may have a polyimide substrate or other polymer substrate on which thin-film circuitry (e.g., thin-film transistors and thin-film capacitors for forming pixel circuits, interconnects, thin-film light-emitting diodes, etc.) is formed and is covered with a layer of encapsulant and/or may have other light-emitting diode circuitry.

In the illustrative configuration of FIG. 4, contacts 68 are electrically coupled (e.g., using solder, conductive adhesive, etc.) to corresponding contacts in signal paths 54 of printed circuit 50MLB. Printed circuit 50MLB, which may sometimes be referred to as a main logic board or printed circuit stack, may have one or more layers such as printed circuit sublayers (printed circuits) 50A, 50B, and 50C. As shown in FIG. 4, sublayers 50A, 50B, and 50C may contain interconnected signal paths 54 (sometimes referred to as metal traces or interconnects). Components 54 may be embedded in the dielectric material forming the substrate(s) of printed circuit 50MLB (e.g., as shown by the embedded component 52 of printed circuit 50 of FIG. 3) and/or may be attached to the exposed surfaces of printed circuit 50MLB. In the example of FIG. 4, some of components 52 (e.g., a display driver integrated circuit and/or other integrated circuits or other components 52) may be mounted to the exposed surface of printed circuit layer 50A and may be cooled by air in air gap 72. Other components 52 may be mounted to the opposing surfaces of printed circuit layer 50C and may include sensors 16 (e.g., an inertial measurement unit containing an accelerometer, compass, and/or gyroscope), a power management unit, and/or other components 52. Some or all of the components in assembly 60 may be overlapped by display 14 (e.g., these components may lie within the footprint of display 14 when viewed in direction 73). Printed circuit connector 62 (e.g., a board-to-board connector) may mate with corresponding printed circuit connector 64 on a printed circuit such as flexible printed circuit 66. Flexible printed circuit 66 may contain signal lines that couple printed circuit assembly 60 with control circuitry, communications circuitry, sensor circuitry, input-output devices, and/or other components 52 in device 10 (e.g., another printed circuit assembly, a component module, etc.). Printed circuit 50MLB may be a rigid printed circuit, may be a flexible printed circuit, or may be a rigid flex circuit containing both rigid and flexible areas.

The arrangement of printed circuit assembly 60 of FIG. 4 in which display 14 is coupled directly to printed circuit 50MLB, which may sometimes be referred to as forming a "main logic board", may help conserve space within the potentially tight confines of the interior of housing 12. This helps device 10 to be compact. Signal-to-noise ratios may be enhanced within assembly 60, because the number of signal lines running between different printed circuits in different portions of device 10 can be maintained at a satisfactorily low number. Fewer wireless interference paths may be produced because the locations of potentially interfering components 52 within assembly 60 can be controlled and mitigation strategies (ground shielding, etc.) can be employed within assembly 60. Signal path power loss can be reduced because overall signal path lengths can be reduced. The number of board-to-board connectors used in device 10 can also be limited, thereby helping to lower board-to-board-connector power losses.

Figure 5:
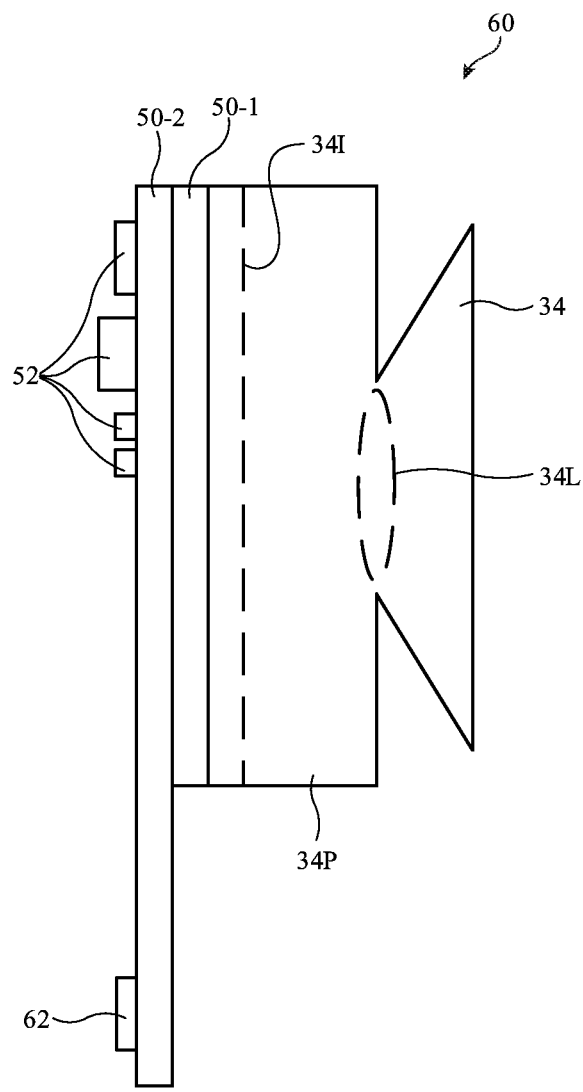
FIGS. 5 and 6 are side views of illustrative assemblies with cameras in accordance with embodiments.

Another illustrative printed circuit assembly is shown in FIG. 5. In the configuration of FIG. 5, printed circuit assembly 60 includes camera 34. Camera 34, which may sometimes be referred to as a packaged image sensor or image sensing device, may have camera package (body) 34P (e.g., a package formed from polymer or other dielectric), supporting a lens such as lens 34L and an image sensor such as image sensor 34I. Image sensor 34I may have an array of image sensor pixels (e.g., a two-dimensional array of sensor pixels on a semiconductor die). The die on which the image sensor is formed may contain control circuitry for the image sensor. The die may be mounted to a substrate internal to the package of camera 34 and/or may be mounted directly to an external substrate. Camera 34 may overlap components 52 such as an inertial measurement unit, other sensors, and/or other electrical components.

In the example of FIG. 5, camera 34 of assembly 60 is mounted on printed circuit 50-1, which, in turn, is mounted to printed circuit 50-2. Printed circuits 50-1 and 50-2 may be rigid printed circuits, flexible printed circuits, and/or rigid flex printed circuits. Printed circuits 50-1 and 50-2 may collectively be referred to as forming a printed circuit stack or may collectively or separately be referred to as forming a main logic board. In an illustrative configuration, printed circuit 50-1 is a rigid printed circuit and printed circuit 50-2 is a flexible printed circuit having board-to-board connector 62 to connect the circuitry of camera 34 and the other circuitry coupled to printed circuits 50-1 and 50-2 to other circuitry in device 10. Printed circuits 50-1 and 50-2 may be electrically and mechanically coupled to each other using adhesive, solder, conductive adhesive, welds, and/or other connections. If desired, printed circuits 50-1 and 50-2 may be formed from a single printed circuit substrate or three or more separate printed circuit substrates may be used in forming the printed circuit interconnects for assembly 60.

Electrical components 52 may be mounted to printed circuits 50-1 and/or 50-2. Components 52 may include integrated circuits, discrete components, and/or other components forming circuitry 20, circuitry 22, and/or input-output devices 24 of FIG. 2. For example, components 52 may include an inertial measurement unit (e.g., an accelerometer, gyroscope, and/or compass) for measuring the orientation of camera 34. In this type of arrangement, the movements of the inertial measurement unit and camera may be tightly coupled, helping to enhance the accuracy of camera orientation measurements.

Figure 6:
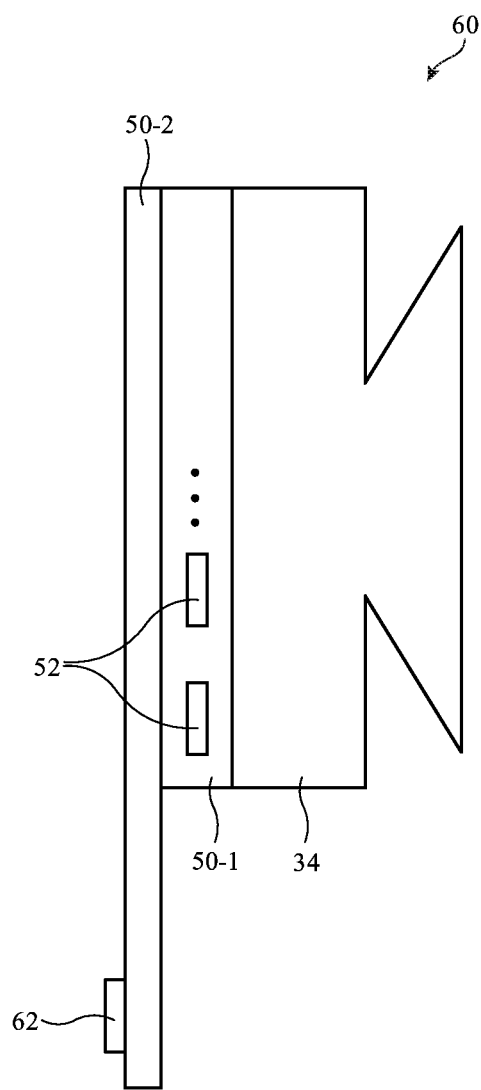

Camera 34 of assembly 60 may face outwardly from device 10 and components 52 may be mounted on an opposing inwardly facing exposed surface of printed circuit 50-2. If desired, an inertial measurement unit and/or other components 52 may be embedded within printed circuit 50-1, as shown in FIG. 6.

Figure 7:
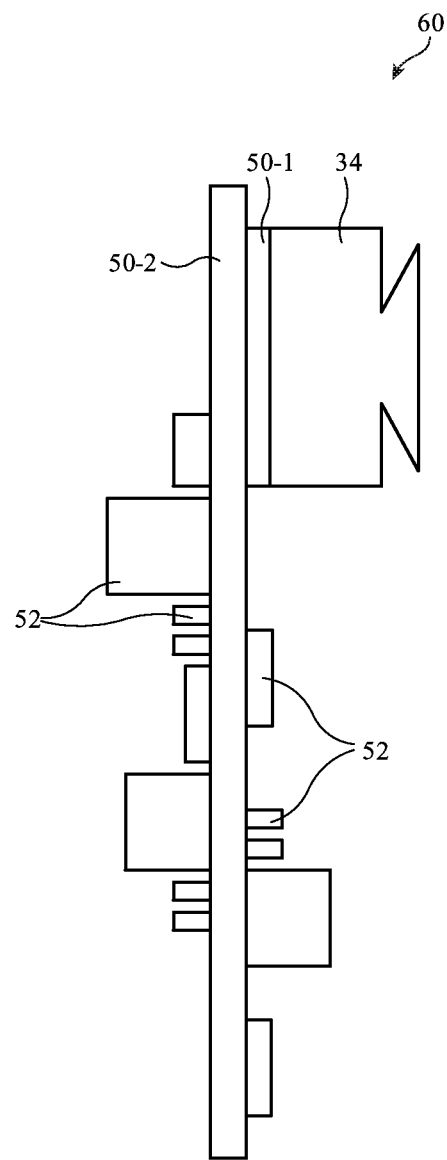
FIG. 7 is a side view of an illustrative camera system in accordance with an embodiment.

In the illustrative configuration of FIG. 7, the body of camera 34 has been mounted to printed circuits 50-1 and 50-2. Camera 34 may be mounted directly to printed circuit 50-1, which is mounted to printed circuit 50-2, camera 34 may be mounted directly to printed circuit 50-2 (e.g., printed circuit 50-1 may be omitted), and/or other printed circuit board layers may be coupled to printed circuit 50-1 and/or printed circuit 50-2 to carry signals associated with components 52 and/or camera 34. In the example of FIG. 7, components 52 (e.g., an internal measurement unit and/or other sensors 16, control circuitry 20, communications circuitry 22, and/or other input-output devices 24) have been mounted to a first area of the inwardly facing (interior-facing) surface of printed circuit 50-2 that is overlapped by camera 34, to a second area of the inwardly facing surface of printed circuit 50-2 that is not overlapped by camera 34, and to an opposing outwardly facing (external-facing) surface of printed circuit 50-2.

Camera 34 may have a sensor die that is mounted to a printed circuit substrate (package substrate) that forms part of camera 34 or may have a sensor die that is mounted to an external printed circuit (e.g., printed circuit 50-1 and/or printed circuit 50-2). Cross-sectional side views of camera 32 in first and second illustrative mounting arrangements are shown in FIGS. 8 and 9.

Figure 8:
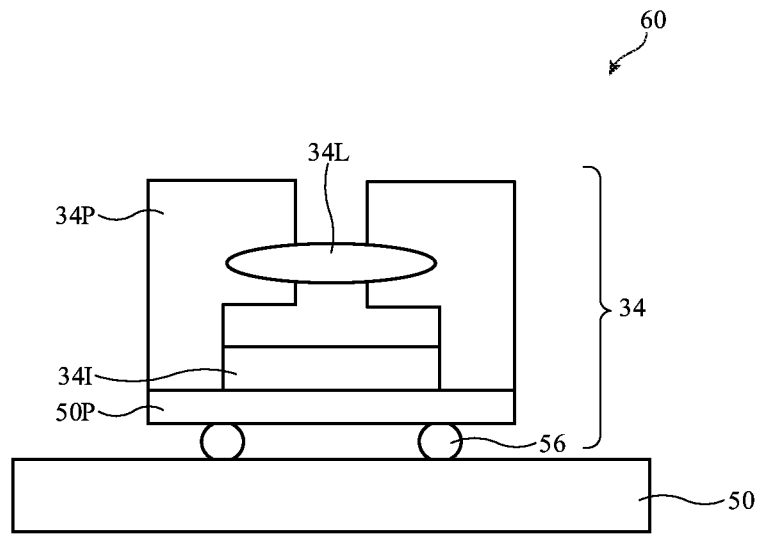
FIG. 8 is a cross-sectional side view of an illustrative camera with a package substrate that is electrically coupled to a printed circuit in accordance with an embodiment.

In the example of FIG. 8, camera 32 include lens 32L, camera package (body) 32P, and image sensor die 34I. Die 34I is mounted to a camera printed circuit substrate such as camera package substrate 50P. Solder joints 56 and/or other conductive connections may be formed between the contacts and other signal traces of substrate 50P and the contacts and other signal traces of printed circuit 50. Printed circuit 50 of FIG. 8 may be mounted to a printed circuit such as printed circuit 50-1 or printed circuit 50-2 of FIGS. 5, 6, and/or 7, printed circuit 50 of FIG. 8 may serve as printed circuit 50-1 of FIGS. 5, 6, and/or 7, and/or printed circuit 50 of FIG. 8 may serve as printed circuit 50-2 of FIGS. 5, 6, and/or 7 (as examples).

Figure 9:
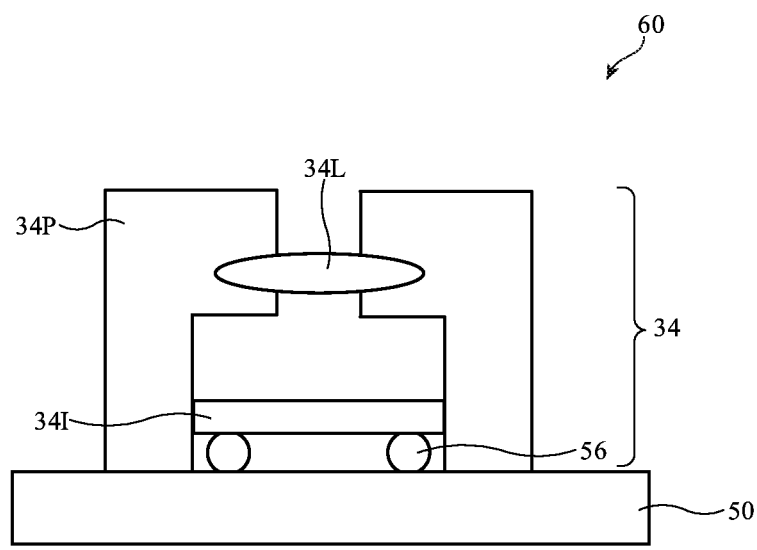
FIG. 9 is a cross-sectional side view of an illustrative camera with an image sensor that is electrically coupled to a printed circuit in accordance with an embodiment.

In the illustrative example of FIG. 9, camera 34 does not include a camera package substrate such as camera package substrate 50P of FIG. 8. Rather, image sensor die 34I of camera 34 is mounted directly to printed circuit 50 (e.g., using solder 56 or other conductive connections). As with the illustrative configuration of FIG. 8, printed circuit 50 of FIG. 9 may be mounted to a printed circuit such as printed circuit 50-1 or printed circuit 50-2 of FIGS. 5, 6, and/or 7, printed circuit 50 of FIG. 9 may serve as printed circuit 50-1 of FIGS. 5, 6, and/or 7, and/or printed circuit 50 of FIG. 9 may serve as printed circuit 50-2 of FIGS. 5, 6, and/or 7.

Adhesive (see, e.g., adhesive 58 of FIG. 3) may help mechanically strengthen the attachment between camera 34 and substrates to which camera 34 is attached. For example, a layer of adhesive (e.g., polymer adhesive) may be interposed between camera body 34P and/or other portions of camera 34 and a printed circuit to which camera 34 is being mounted. If desired, polymer adhesive (e.g., underfill) may be used in attaching package substrate 50P of FIG. 8 to printed circuit 50 and/or polymer adhesive (e.g., underfill) may be used in attaching sensor die 34I to printed circuit 50 (see, e.g., FIG. 9).

As described above, one aspect of the present technology is the gathering and use of information such as information from input-output devices. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to calculated control of the delivered content.

Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

The foregoing is illustrative and various modifications can be made to the described embodiments. The foregoing embodiments may be implemented individually or in any combination.

What is claimed is:

1. An electronic device, comprising:
    a camera;
    a printed circuit to which the camera is mounted; and
    an orientation sensor coupled to the printed circuit that is configured to measure an orientation of the camera, wherein the printed circuit comprises a flexible printed circuit substrate to which the orientation sensor is mounted and comprises a rigid printed circuit substrate.

2. The electronic device defined in claim 1 further comprising:
    a display configured to display an image; and
    a lens through which the image is viewable, wherein the orientation sensor comprises an orientation sensor selected from the group consisting of: an accelerometer, a gyroscope, and a compass.

3. The electronic device defined in claim 1 wherein the camera is attached to a first surface of the rigid printed circuit substrate and wherein the rigid printed circuit substrate has an opposing second surface that is attached to the flexible printed circuit substrate.

4. The electronic device defined in claim 1 wherein the orientation sensor is soldered to the flexible printed circuit substrate and wherein the rigid printed circuit substrate is soldered to the flexible printed circuit substrate.

5. The electronic device defined in claim 1 wherein the camera comprises a camera body, a camera lens coupled to the camera body, and an image sensor coupled to the camera body.

6. The electronic device defined in claim 5 wherein the image sensor is directly soldered to the rigid printed circuit substrate.

7. The electronic device defined in claim 5 wherein the camera further comprises a camera printed circuit substrate to which the image sensor is soldered and wherein the camera printed circuit substrate is soldered to the rigid printed circuit substrate.

8. The electronic device defined in claim 1 wherein the camera overlaps the orientation sensor.

9. The electronic device defined in claim 1 wherein the orientation sensor is embedded in the printed circuit.

10. The electronic device defined in claim 9 wherein the orientation sensor is between the flexible printed circuit substrate and the camera.

11. An electronic device, comprising:
    a display panel having an array of pixels configured to produce an image;
    a lens through which the image is visible;
    a first printed circuit to which the display panel is mounted;
    a first sensor coupled to the first printed circuit and overlapped by the display panel;
    a camera; and
    a second printed circuit to which the camera is mounted.

12. The electronic device defined in claim 11 further comprising a second sensor mounted to the second printed circuit, wherein the second sensor comprises a sensor selected from the group consisting of: an accelerometer, a gyroscope, and a compass.

13. The electronic device defined in claim 11 wherein the first printed circuit comprises a first printed circuit layer, a second printed circuit layer, and a third printed circuit layer, wherein the first and third printed circuit layers are separated by an air gap in a first area and are coupled together by the second printed circuit layer in a second area.

14. The electronic device defined in claim 13 further comprising an integrated circuit in the air gap.

15. The electronic device defined in claim 14 wherein the second printed circuit includes a rigid printed circuit to which the camera is soldered and a flexible printed circuit attached to the rigid printed circuit.

16. The electronic device defined in claim 11 wherein the first printed circuit comprises a stack of multiple printed circuit substrates.

17. An electronic device, comprising:
    a housing;
    a lens; and
    a printed circuit assembly in the housing, wherein the printed circuit assembly comprises:
        a display panel having an array of pixels configured to produce an image viewable through the lens;
        a printed circuit stack to which the display panel is mounted, wherein the printed circuit stack has a first printed circuit layer and a second printed circuit layer separated in a first area by an air gap and joined in a second area by an interposed third printed circuit layer; and
        an electrical component in the air gap that is mounted to the first printed circuit layer.

18. The electronic device defined in claim 17 wherein the printed circuit assembly further comprises an orientation sensor coupled to the printed circuit stack and wherein the orientation sensor comprises an orientation sensor selected from the group consisting of: an accelerometer, a gyroscope, and a compass.

19. The electronic device defined in claim 18 wherein the electrical component comprises a display driver integrated circuit.

20. The electronic device defined in claim 1 further comprising:
   a head-mounted housing on which the camera is located; and
   a display mounted on the head-mounted housing.

* * * * *